United States Patent
Shi et al.

(10) Patent No.: US 6,332,083 B1
(45) Date of Patent: Dec. 18, 2001

(54) APPARATUS AND ASSOCIATED METHOD, FOR OPERATING ON RECEIVE SIGNALS RECEIVED AT A RECEIVER

(75) Inventors: Zhongming Shi, San Diego; Ken Hsu, Irvieg, both of CA (US)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 09/281,522

(22) Filed: Mar. 30, 1999

Related U.S. Application Data

(60) Provisional application No. 60/079,834, filed on Mar. 30, 1998.

(51) Int. Cl.$^7$ ................................. H04B 1/38; H04B 1/10
(52) U.S. Cl. .......................... 455/552; 455/553; 455/339; 455/131; 375/350
(58) Field of Search ..................................... 455/552, 553, 455/131, 323, 334, 339; 375/350, 346

(56) References Cited

U.S. PATENT DOCUMENTS

| | | | |
|---|---|---|---|
| 5,406,615 | * | 4/1995 | Miller, II et al. ...................... 455/552 |
| 5,794,159 | * | 8/1998 | Portin ..................................... 455/553 |
| 5,915,212 | * | 6/1999 | Przelomiec et al. .................... 455/83 |
| 6,029,052 | * | 2/2000 | Isberg et al. ........................... 455/131 |
| 6,148,048 | * | 11/2000 | Kerth et al. ............................ 375/350 |

\* cited by examiner

*Primary Examiner*—Nay Maung
*Assistant Examiner*—Erika A. Gary
(74) *Attorney, Agent, or Firm*—Milan I. Patel

(57) ABSTRACT

Apparatus, and an associated method, for the IF stage of a receiver, such as the receive portion of a multi-mode mobile station. Direct conversion of an IF-stage receive signal is made into the digital domain through the use of a ΣΔ analog-to-digital converter. Increased portions of the receiver processes signals in the digital domain using digital-domain circuitry.

20 Claims, 7 Drawing Sheets

APPARATUS AND ASSOCIATED METHOD, FOR OPERATING ON RECEIVE SIGNALS RECEIVED AT A RECEIVER

This Appln. claims benefit of Prov. No. 60/079,834 filed Mar. 30, 1998.

The present invention relates generally to the reception of receive signals at a receiver, such as the receive portion of a radio telephone operable in a cellular communication system. More particularly, the present invention relates to receiver apparatus, and an associated method, which digitizes receive signals at an IF (intermediate frequency) stage of the receiver, thereby to permit increased portions of the signal processing elements of the receiver to be performed in a digital domain. Such increased signal processing in the digital domain permits improved performance of the receiver and also permits simplification of receiver construction, particularly when the receiver forms a portion of a multi-mode device, such as a multi-mode, radiotelephone.

BACKGROUND OF THE INVENTION

A communication system permits the communication of information between two or more communication stations. The communication stations are connected by a communication channel upon which a communication signal is transmitted. The communication signal includes the information which is to be communicated between the communication stations. In a two-way communication system, a communication station includes both a transmitter portion and a receiver portion operable to transmit and to receive respectively, communication signals. Thereby, information can be both transmitted and received at a single communication station. In a duplex communication system, communication signals can be both transmitted and received concurrently, or seemingly concurrently.

A radio communication system is a communication system in which the communication channel formed between the communication stations is a radio channel defined upon a portion of the electromagnetic spectrum. When a communication station operable in such a communication system includes both a transmitter portion and a receiver portion, the communication station forms a radio transceiver, capable of two-way radio communication with another communication station. Because communication signals can be transmitted between radio transceivers on radio channels, wireline connections are not required to effectuate communications in a radio communication system. Thereby, communications are possible by way of a radio communication system when formation of a wireline connection between the communication stations would be impractical.

A cellular communication system is an exemplary radio communication system. Cellular communication systems, constructed according to various standards, have been installed throughout significant portions of the world. A subscriber to a cellular communication system is able to communicate telephonically by way of a radio transceiver, typically referred to as a mobile station, when the mobile station is positioned within an area encompassed by the communication system. Telephonic communication of both voice information and data information is permitted in such networks.

Various cellular communication system standards have been developed, and existing cellular communication systems are constructed pursuant to such standards. And, various new proposed standards have been set forth pursuant to which additional cellular communication systems are to be constructed. Various of the standards which define various ones of the cellular communication systems are operable in different manners and require different apparatus, both to form the network infrastructure of such systems, as well as the mobile stations operable therein.

Various mobile stations have been constructed to be operable in more than one cellular communication system. Dual-mode mobile stations, for instance, are available to permit a user to communicate alternately by way of two different cellular communication systems. More generally, multi-mode mobile stations have been developed to permit their operation in multiple different types of cellular communication systems. The mobile station typically must include circuitry specifically constructed for each of the different cellular communication systems in which the mobile station is operable. Because signals generated and received pursuant to operation of the different cellular communication systems are operable, variously, at different frequency ranges, with different modulation schemes, and coding schemes, etc., little of the circuitry required of the mobile station to permit its operation in the different communication systems can be shared. That is to say, significant portions of the circuit paths of the receive and transmit portions of the mobile station required for its operation in the various communication systems cannot be shared. Separate, but functionally redundant, circuit elements are required for the different circuit paths to permit operation of the mobile station in the various communication systems.

Such duplication increases the complexity of the mobile station as well as the cost of the mobile station.

Also, in a typical radio receiver, even a radio receiver operable in a digital communication scheme, significant portions of the receiver circuitry operate on analog signals. Only after the received signals are converted to a base band frequency are the signals typically converted to digital form to permit digital processing thereof.

With advances in digital circuitry, processing of signals in a digital, rather than an analog, domain would permit both better and more cost-efficient processing of the signals.

A manner by which to facilitate processing of signals generated during operation of a communication system in a digital, rather than an analog, domain, would therefore be advantageous.

A manner by which to permit sharing of increased portions of the circuitry of a multi-mode radio device would also be advantageous.

It is in light of this background information related to radio devices that the significant improvements of the present invention have evolved.

SUMMARY OF THE INVENTION

The present invention, accordingly, advantageously provides apparatus, and an associated method, by which to digitize receive signals at an IF (intermediate frequency) stage of a receiver, such as the receiver portion of a cellular radiotelephone. By digitizing the receive signals at an IF, rather than base band, frequency, increased portions of processing performed by the receiver are in the digital, rather than analog, domain. Such digitizing of the signals at an IF frequency permits simplification of the construction of the device and also permits improvement in the performance of the device.

In one implementation, apparatus is provided for a multimode radiotelephone operable in two or more radio communication systems. Signals provided to the multi-mode radiotelephone are digitized at an IF stage of the receiver portion of the radiotelephone. The RF (radio frequency) and IF stages of the receiver portion of the radiotelephone are shared elements. That is, the RF stage and IF stage are common to the circuitry which is used to receive signals generated by network infrastructure of the various communication systems. Circuit simplification and cost efficiencies concomitant therewith result.

In one aspect of the present invention, receive signals received at a receiver are converted in frequency to an IF frequency level and then applied to a ΣΔADC (sigma-delta analog-to-digital converter). The ΣΔADC exhibits a signal transfer function and a noise transfer function. The two transfer functions are dissimilar with one another. When a signal is applied to the ADC, the signal is digitized. Quantization noise generated during digitizing of the signal is shifted in frequency. Such shifting in frequency facilitates processing of the informational content of the digitized receive signal as, once shifted in frequency, the noise is readily filtered.

In another aspect of the present invention, the ΣΔADC forms a portion of the IF stage of a multi-mode radiotelephone. Signals converted into IF frequencies are applied to a bandpass filter which exhibits a bandpass of frequencies corresponding to the widest frequency band of the two or more communication systems pursuant to which the multi-mode radiotelephone is operable. The signals filtered by the bandpass filter are provided to the ΣΔADC. Digitized signals formed by the ΣΔADC are provided to I and Q mixers which are formed of XOR (exclusive-or) logical gates. Mixing signals applied to the mixers are of simple forms of repeating sequences of binary digits, readily implementable to be perfectly orthoganol to one another and absolutely exact.

In one implementation, a tri-mode mobile station is provided. The tri-mode mobile station is operable in a TDMA (time-division multi-access) system, a CDMA (code-division multiple-access) system, and an AMPS (advanced mobile phone service) system. A down-converter converts RF signals into IF signals at an IF stage of the mobile station. The IF signals are provided to a bandpass filter which exhibits a filter bandwidth corresponding to the bandwidth of the receive signals generated in a CDMA communication system. The signals filtered by the filter are provided to a bandpass ΣΔADC. Digitized signals formed by the ADC are then digitally mixed by a digital mixer, such as an exclusive-or gate. Digitally-mixed signals are then provided to separate circuit paths which are operable to perform digital processing functions pursuant to the three communication systems in which the mobile station is operable.

In other implementations, other multi-mode mobile stations are formed. Such multi-mode mobile stations are formed to be operable in any of various combinations of communication systems, including for instance, combinations of TDMA systems—such as USDC (United States Digital Cellular), GSM (Global System for Mobile Communications), and PDC (Pacific Digital Cellular) systems, CDMA systems, or FDMA systems. Exemplary CDMA systems include WCDMA (wideband code division multiple access) CDMA2000, and IS-95 implementations.

In another aspect of the present invention switch harmonic subsampling is utilized for the ΣΔADC. Advantage is taken of the strong harmonic components of a square wave used to generate a clock signal. Harmonic components of the clock signal, such as the second and third harmonic components of the signal, are mixed with the IF signal to form a significant output product. By causing the clock rate to be four times that of the center frequency of the IF signals, clock frequencies permitting operation of the ΣΔADC at operable rates is provided.

In these and other aspects, therefore, apparatus, and an associated method, is provided for operating upon signals generated during operation of a first radio communication system and at least a second radio communication system. Such signals are provided to a multi-mode radio receiver which is operable to receive first receive signals generated during operation of the first radio communication system and to receive the at least second radio communication signals generated during operation of the at least the second radio communication system. The first radio communication system is operable within a first frequency bandwidth, and the second radio communication system is operable within a second frequency bandwidth. A converter is coupled to receive indications of the first receive signals when received at the radio receiver and to receive indications of the at least the second receive signals when received at the radio receiver. The converter converts the indications received thereat to a first-converted frequency range, to selectively form first-converted first receive signals of the first frequency bandwidth and selectively to form at least first-converted second receive signals of at least the second frequency bandwidth. The bandpass digitizer is coupled to the converter to receive the first-converted first receive signals and the at least the first-converted second received signals. The bandpass digitizer exhibits a signal transfer function and a noise transfer function having dissimilar characteristics. The bandpass digitizer generates digitized signals in which noise generated by the internal quantizer is shifted in frequency.

A more complete appreciation of the present invention and to the scope thereof can be obtained from the accompanying drawings which are briefly summarized below, the following detailed description of the presently-preferred embodiments of the present invention and the appended claims.

Figure 2:
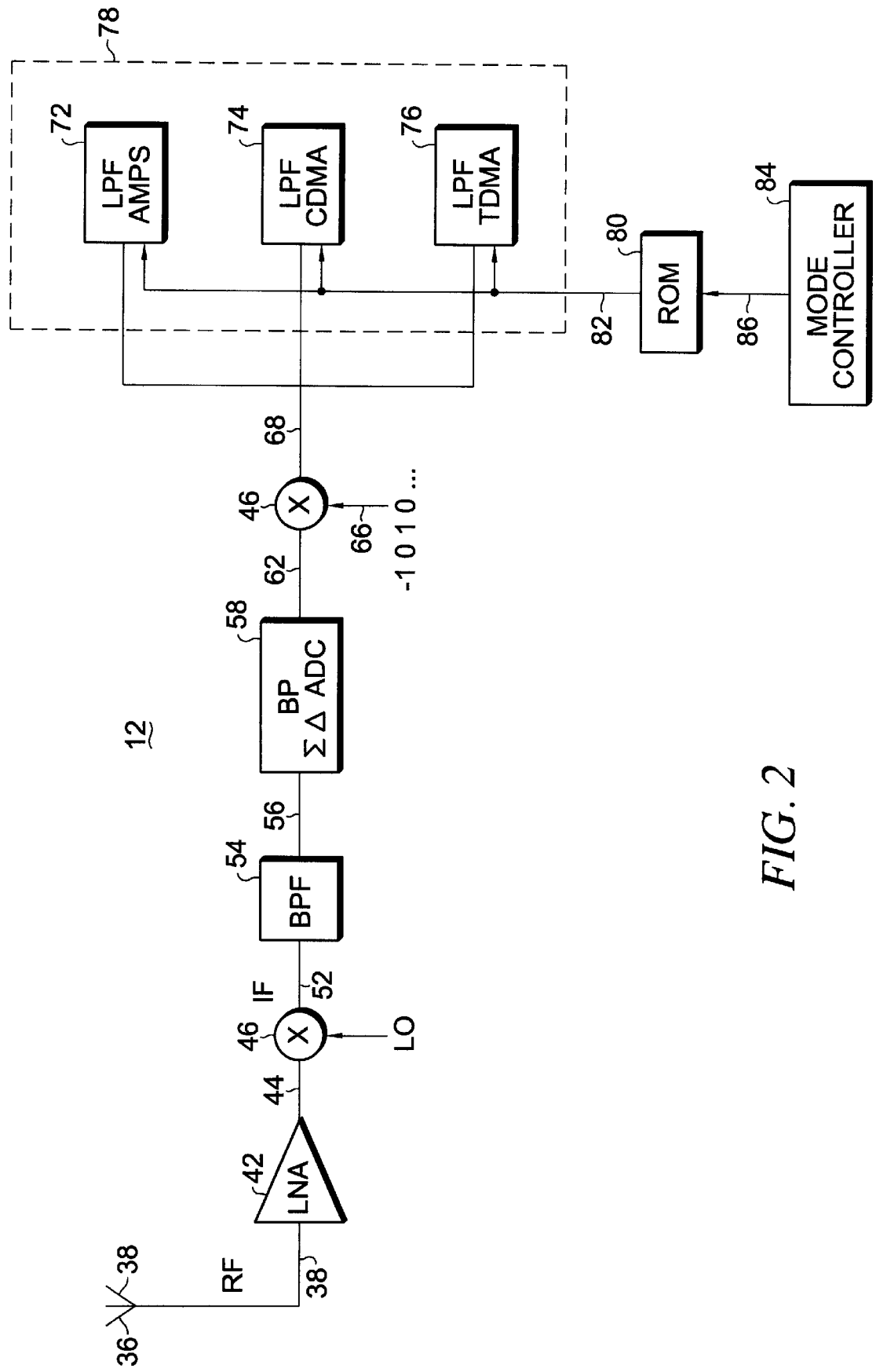
FIG. 2 illustrates a simplified, functional block diagram of a mobile station of an embodiment of the present invention.

signal, exemplary of an IF signal applied to the ΣΔADC forming a portion of the mobile station shown in FIG. 2.

Figure 8:
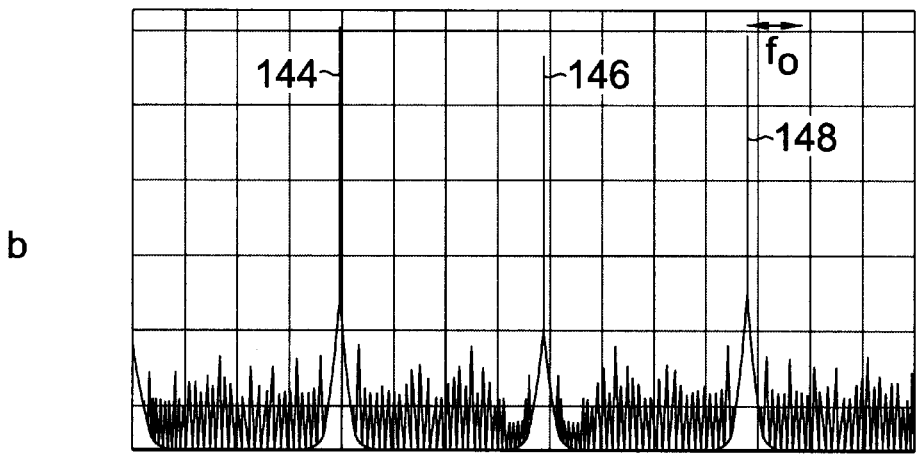

FIG. 8 illustrates a graphical representation of the power spectrum of a clock signal generated during operation of an embodiment of the present invention, together with its second and third-order harmonics.

Figure 9:
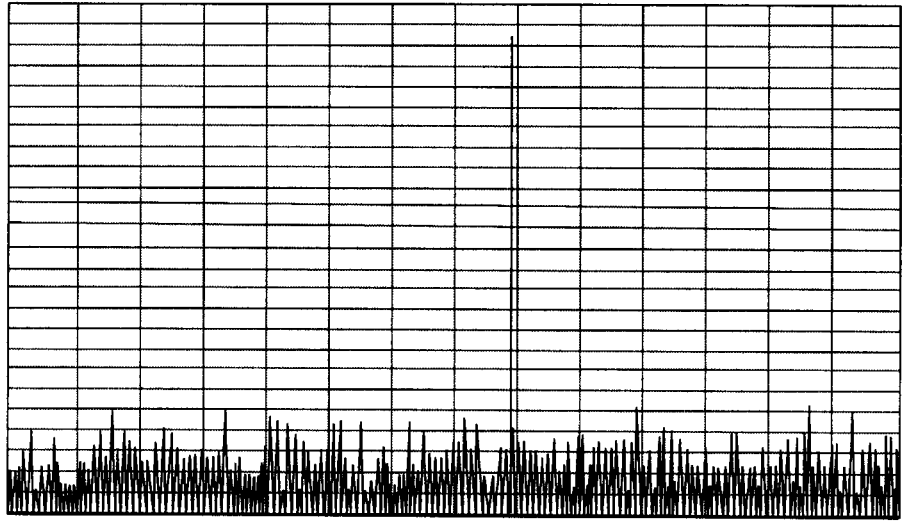

FIG. 9 illustrates a graphical representation of a third-order harmonic sub-sampled output signal generated during operation of an embodiment of the present invention.

Figure 10:
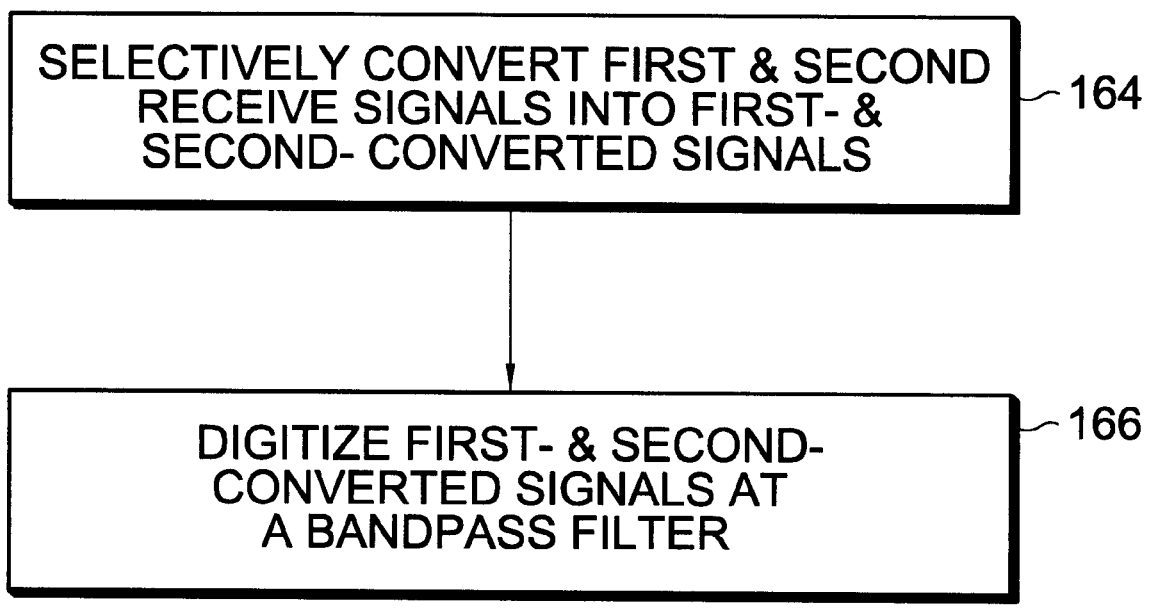

FIG. 10 illustrates a method flow diagram listing the method steps of the method of operation of an embodiment of the present invention.

DETAILED DESCRIPTION OF THE PREFERRED EMBODIMENT

Figure 1:
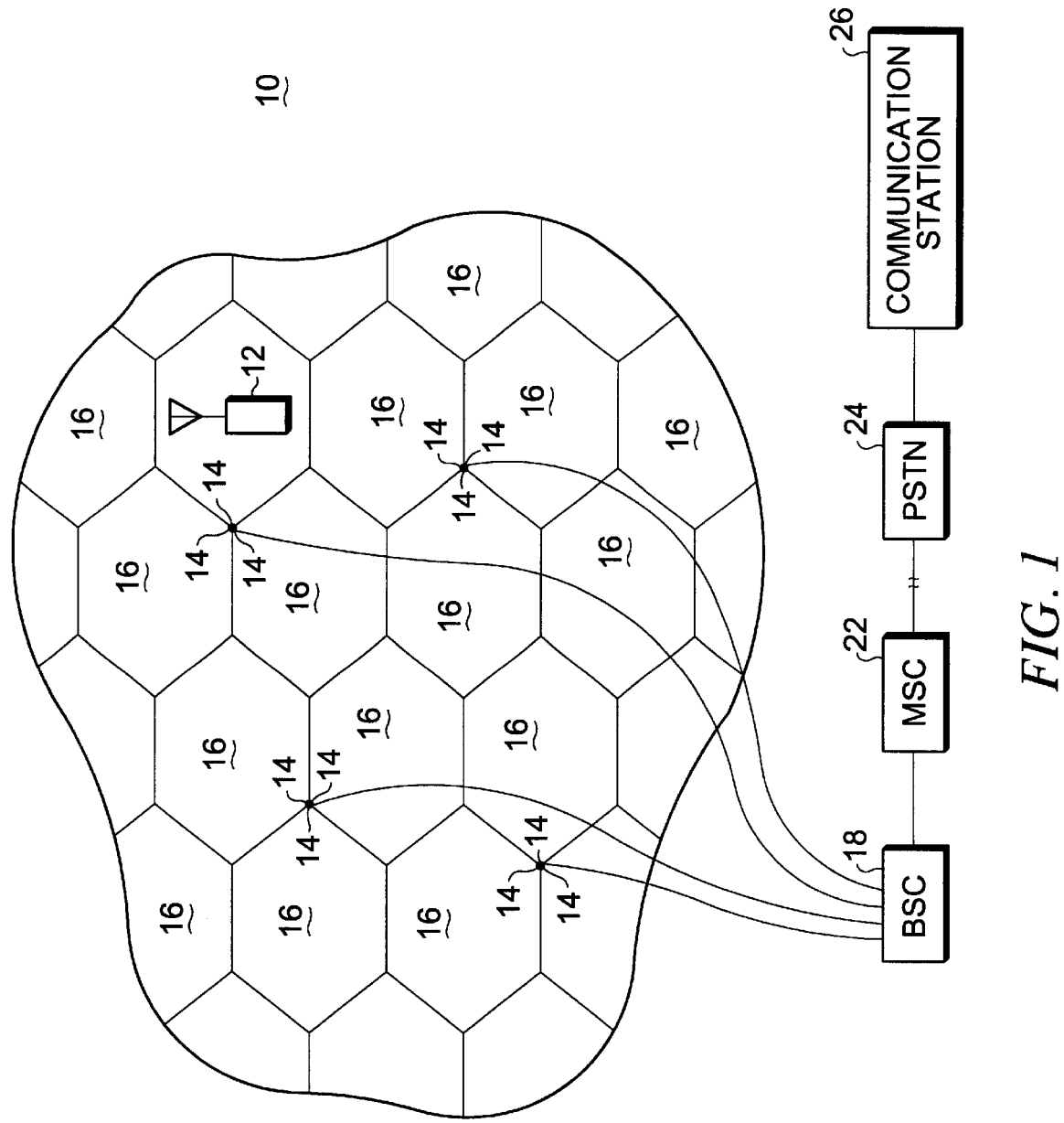
FIG. 1 illustrates a portion of a cellular communication system in which an exemplary embodiment of the present invention is operable.

Referring first to FIG. 1, a portion of a cellular communication system, shown generally at 10, is installed throughout the geographical area. The network infrastructure of the cellular communication system provides for wireless communications with mobile stations of which an exemplary mobile station 12 is shown in the Figure.

The system 10 includes a plurality of spaced-apart radio base stations 14 which are positioned at spaced locations throughout the geographical area to be encompassed by the communication system. In the implementation shown in the Figure, sets of three radio base stations are co-located. Each base station defines a cell, and the cells 16 together collectively cover the area encompassed by the communication system.

The network infrastructure of the exemplary communication system shown in the Figure also includes base station controllers (BSCs) of which the BSC 18 shown in the Figure is representative, and to which groups of radio base stations are coupled. A BSC is operable to control operation of radio base stations coupled thereto. Groups of BSCs 18, in turn, are coupled to an MSC (mobile switching center) 22. The MSC is operable, amongst other things, to perform switching operations. And, the MSC is coupled to a PSTN (public-switched telephonic network) 24, and the PSTN is coupled to communication stations, such as the communication station 26.

The apparatus forming the network infrastructure of the cellular communication system 10 along with the operation of the system, as well as the mobile stations operable therein, is defined by an applicable cellular communication standard. Exemplary of such a standard is the IS-54 standard relating to a TDMA (time division multiple access) communication system, an IS-95 standard relating to a CDMA (code-division multiple access) system, or an appropriate standard relating to an AMPS (advanced mobile phone service) system, all promulgated by the EIA/TIA.

More than one cellular communication system is sometimes installed at the same geographical area. Overlapping, or otherwise contiguously configured network infrastructures are, in such scenarios, both installed over common geographical areas.

Multi-mode mobile stations have been developed and are available to permit a subscriber to utilize such a mobile station to communicate alternately by a selected one of the more-than-one cellular communication systems. However, as noted previously, because the separate communication systems are operable in different manners, conventional mobile stations typically include substantially separate circuit paths for processing the signals generated and received during operation of each of the communication systems pursuant to which the mobile station is operable.

For instance, conventionally, once receive signals are down-converted to an IF (intermediate frequency) level, separate circuit paths corresponding to the different communication systems pursuant to which the mobile station is operable, are coupled to receive the IF signal. Separate bandpass filters are required for each of the circuit paths. Such filters typically are formed of SAW (surface acoustic wave) filters which are relatively large, heavy, and expensive. Each of the circuit paths typically includes separate down-mixers and lowpass filters. The resultant redundancy collectively increases the complexity and cost of the mobile station.

Additionally, CDMA and TDMA circuit paths require both I and Q channel paths, further add to the complexity and cost of the mobile station. I and Q channels are susceptible to cross-talk, embalance or mismatch, and DC-offsets. Such elements are also sensitive to component tolerance, temperature, noise, and non-linear operation. Analog elements usually of higher order devices to meet restrictive system specifications also must be tuned against process variation and must be compensated for their temperature dependence.

FIG. 2 illustrates a mobile station 12 of an exemplary embodiment of the present invention. The mobile station 12 is a multi-mode mobile station, permitting a subscriber to communicate by way of a selected one of a plurality of communication systems, here an AMPS, CDMA, or TDMA communication system. The mobile station 12 reduces the cost and complexity required of a conventional mobile station. The mobile station is constructed in a manner in which signals received thereat are digitized at an IF stage of the mobile station. The number of analog signal processing elements is thereby reduced. Also, because of the digitization of the signal at an IF stage, circuit simplification is also permitted as the IF stage of the mobile station forms a circuit path, to increase portions of the mobile station.

The mobile station 12 is here shown to include any antenna transducer 36 operable to convert electromagnetic, forward-link signals into electrical form on the line 38. The line 38 is coupled to a low noise amplifier (LNA) which amplifies the radio frequency, electrical signals provided thereto, and to generate amplified signals on the line 44.

The line 44 is coupled to a first input terminal of a first down-mixer 46. And, a local oscillator signal ("LO") is provided to a second input terminal of the down-mixer 46. The down-mixer generates a first down-mixed analog signal on the line 52 which is of an IF (intermediate frequency) level.

The IF signal generated on the line 52 is provided to a bandpass filter (BPF) 54. The bandpass filter is selected to exhibit a passband of a frequency range responsive to the communication systems in which the mobile station is operable. More particularly, the passband of the bandpass filter 54 is selected to exhibit a passband of a frequency range breaking off at least to encompass the frequency band within which signals are generated during operation of any of the communication systems in which the mobile station is operable. And, in particular, the passband is of a frequency range determined by the communication system in which forward-link signals of the greatest frequency range. Thereby, only a single IF-stage, bandpass filter is required.

Filtered signals having frequency components within the passband of the bandpass filter 54 are generated on the line 56 and are provided to a ΣΔ analog-to-digital converter (ADC) 58. The ADC 58 is operable, amongst other things, to convert the analog IF signal formed by the bandpass filter 54 on the line 56 into digital form, also at an IF level. The ADC 58 forms a common block, common to all of the circuit paths which define the separate receive paths required of the mobile station to operate in the different communication systems pursuant to which the mobile station is operable. Quantization noise generated pursuant to digitizing of the signal into digital form is shifted in frequency during operation of the ADC. Because of the shifting, or "shaping," of the noise components, within a selected bandwidth, improved signal over noise ratios, or resolutions, result. Also, because the ADC 58 functions to digitize the signal components of the signals applied thereto, the digital signals are more readily operated upon as digital-domain elements are utilized for such additional operations.

Digitized, IF-frequency signals are generated by the ADC 58 on the line 62. Line 62 is coupled to first inputs of digital mixers 64. A digital sequence is generated on the line 66 and is applied to a second input of the digital mixer 64. In an exemplary implementation, the mixer 64 is formed of an exclusive-or (XOR) logical gate. In implementations in which both I- and Q-paths are used, a pair of such logical gates is coupled to the line 62. Sine and cosine mixing signals of simple form are applied to the respective mixers. Such mining signals are easily formed of sequences which are perfectly orthogonal and absolutely exact. Because of such orthogonality and exactness, the DC-offset and I and Q mismatch are eliminated.

Down-mixed signals formed by the mixer 64 are generated on the line 68 and are provided to circuit elements of the different circuit paths of the mobile station. In the exemplary embodiment shown in the Figure, the mobile station 12 is operable in three separate communication systems, such as an AMPS system, a CDMA system, and a TDMA system. Here, separate circuit paths are formed and the down-mixed signal generated by the down-mixer 64 is applied to a lowpass filter 72 of an AMPS circuit path, a lowpass filter 74 of a CDMA circuit path, and a lowpass filter 76 of a TDMA circuit path. The respective lowpass filter 72–76, in one implementation, include shared hardware, such as the multipliers and accumulators of the respective digital filters. To permit such sharing, different sets of coefficients are selected at different times. Thereby, the chip size and cost to implement such digital filters are reduced. It should be noted, of course, that, in other implementations, other combinations of mobile stations are analogously formed. And, in another implementation, the functionality of the filters 72, 74, and 76 is provided by a programmable, digital filter, here represented at 78. The coefficients which define the characteristics of the filter 78 are stored at a ROM (read only memory) 80 and, when accessed, are provided by way of the line 82 to the filter.

In the exemplary embodiment, shown in the FIG. 2, a mode controller 84 controls which mode in which the mobile station is to be operable and accesses the corresponding memory locations of the ROM 80 by way of access lines 86. Selections of the mode controller are made, in one embodiment, responsive to user inputs and, in another embodiment, responsive to system commands provided to the mobile station over a forward-link channel.

Because the ΣΔADC 58 is utilized at the IF-stage of the multi-mode, mobile station, circuit simplification and cost reduction of the mobile station is possible. Ordinary ΣΔADCs are readily available for low speed and high resolution applications. Such ΣΔADCs are relatively inexpensive and relatively reliable and require for their implementation only relatively low accuracy, analog components. Such devices exhibit zero quantization noise at direct current (DC) levels. And, other available ΣΔADCs shift the quantization noise at some other non-zero frequency to obtain good accuracy within a band about such non-zero frequency.

Figure 3:
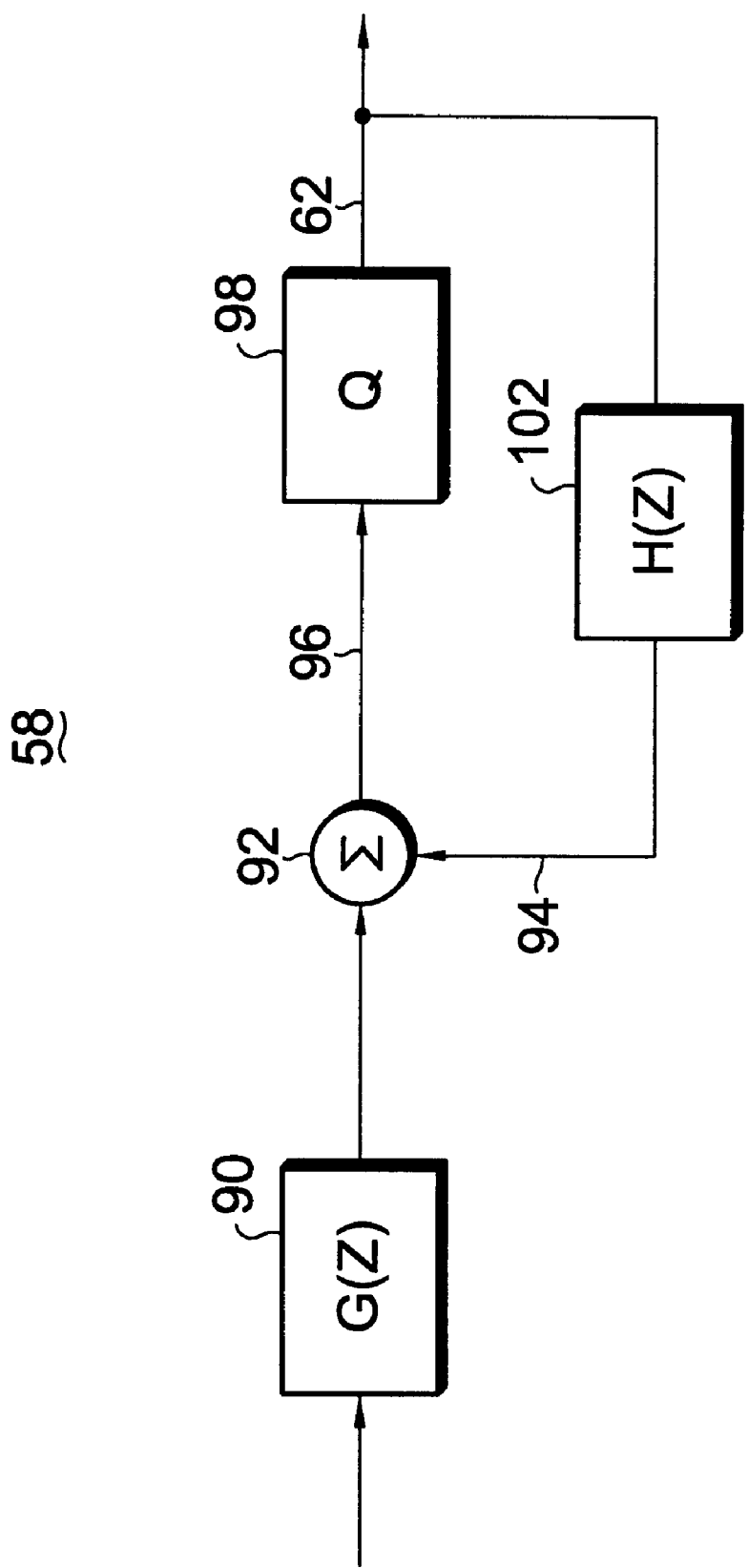
FIG. 3 illustrates a simplified, functional block diagram of an exemplary ΣΔADC (analog-to-digital converter) which forms a portion of the mobile station shown in FIG. 2.

FIG. 3 illustrates a ΣΔADC 58 which forms a portion of an embodiment of the present invention, operable to digitize a signal applied thereto, here by way of the line 56. The ΣΔADC exhibits both a signal transfer function and a noise transfer function. The transfer functions are dissimilar, thereby to treat the signal components line 56 and noise components generated by the quantizer 98 differently.

The line 56 is here shown to be coupled to a first input of a summing device 92. A signal generated on the line 94 is coupled to a second input of the summing device. The summing device 92 is operable to generate a summed signal on the line 96 which is coupled to a quantizer 98. The quantizer 98 generates a quantized signal, viz., a digital sequence, on the line 62. The feedback path, which includes the line 94, is coupled between the line 62 and the input to be summing device 92 and includes a filter element, here H(z)102. During operation, quantization noise generated as a byproduct of operation of the quantizer 98 is shifted in frequency, thereafter to be more easily filtered by other elements of the mobile station.

The ΣΔADC 58 shown in the FIG. 3 is a first order, ΣΔ device. Higher-order devices can similarly be shown.

Figure 4:
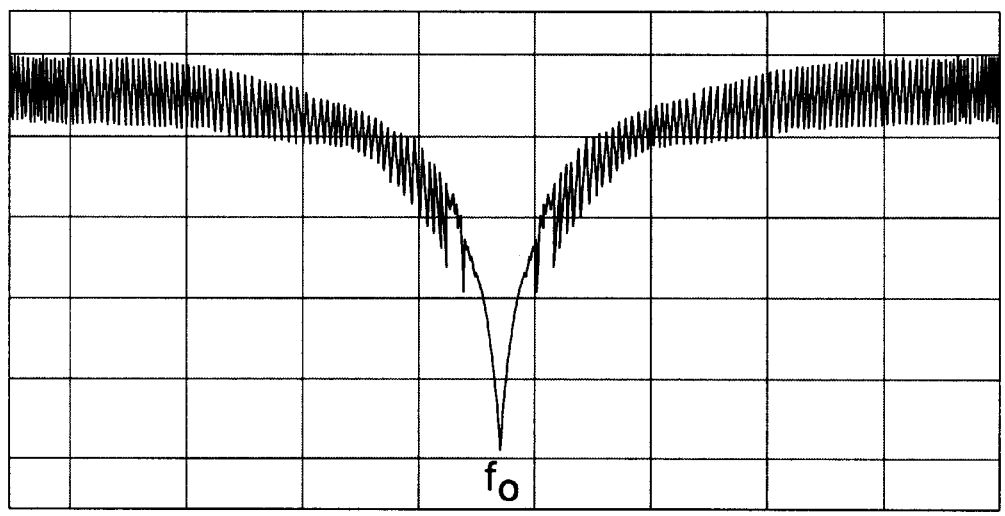
FIG. 4 illustrates a graphical representation of the output spectrum of a ΣΔADC forming a portion of the mobile station shown in FIG. 2 and operable pursuant to an embodiment of the present invention.

FIG. 4 illustrates a graphical representation, shown generally at 108, of the power spectrum of a signal generated by the ΣΔADC 58 forming a portion of the mobile station 12 (shown in FIG. 2) of an embodiment of the present invention. Here, the power spectrum is that of an eighth order ΣΔADC. The power spectrum is centered at 9.85 MHz and is clocked at a clock frequency of 39.4 MHz. Review of the power spectrum indicates that noise shaping moves quantization noise away from the center frequency, $f_0$. At frequencies close to $f_0$ where the noise transfer function approaches a zero value, higher signal accuracy results due to the higher signal over noise ratio. As the center frequency is moved from a DC level to $f_0$, to obtain a similar resolution to that which would appear at a baseband level, the order of the ΣΔADC is generally doubled. By increasing the order of the ΣΔADC, the out-of-band noise levels are reduced. An over sampling ratio is determined by half of the clock frequency and the signal bandwidth, rather than the center frequency.

Figure 5:
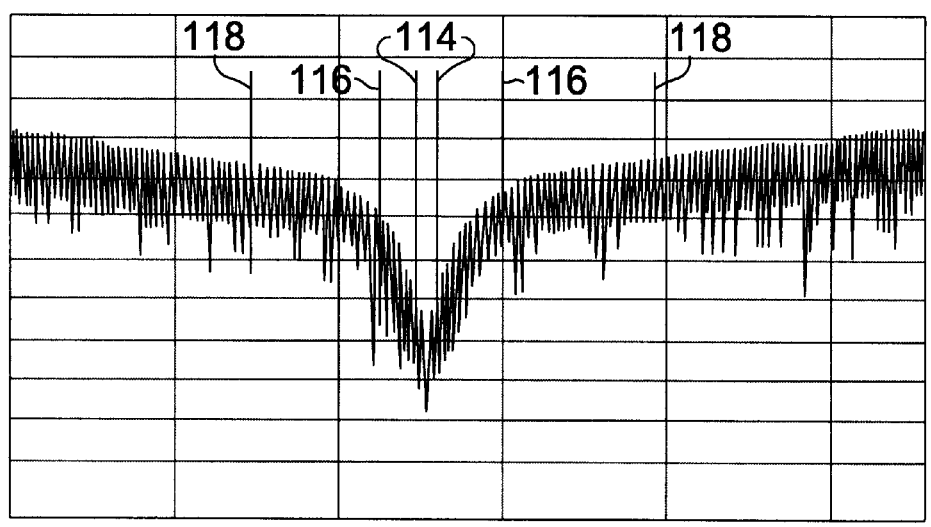
FIG. 5 illustrates a (graphical representation, similar to that shown in FIG. 2, but here in which forward-link signals generated pursuant to operation of a CDMA (code-division multiple-access), a TDMA (time-division multiple-access), and an AMPS (advanced mobile phone service) communication systems are received at the mobile station shown in FIG. 2.

FIG. 5 illustrates a graphical representation 112, here representing the output power spectrum of a fourth-order bandpass ΣΔADC 58 during operation of an embodiment of the present invention in which an AMPS, a TDMA, and a CDMA signal are received at the mobile station. Such signals are tuned to their respective center frequencies for purposes of example. A component portion 114 is representative of an AMPS component and here exhibits an 87 dB signal over noise ratio (greater than 14 bits) within a 30 kilohertz bandwidth associated with conventional AMPS signaling. A component portion 116 is representative of a TDMA component, here exhibiting a 71 dB signal over noise ratio (greater than 11 bits) within a 135 kHz bandwidth, conventional of TDMA communications. And, a component portion 118, representative of a CDMA component, exhibits a 47 dB signal over noise ratio (greater than 7 bits) within a 615 kHz bandwidth conventionally associated with CDMA communications. The power spectrum 112 is here exemplary of that which is generated with a fourth-order ΣΔADC. The power spectrum is similar to that of a second order device, but the analog to digital conversion is here carried out in a passband not in baseband of a conventional approach.

In the exemplary power spectrum shown in the Figure, noise shaping provided by the ΣΔADC 58 opens a low-noise window within the signal band of interest. Due to the noise shaping, filter requirements for other filter 54 (shown in FIG. 2), can be relaxed. Residual, unwanted, out-of-band signals and noise form part of a quantization noise background which can be filtered out by such digital filters 72, 74, and 76. As a result, fewer bandpass filters are required to form portions of the mobile station 12 which includes a ΣΔADC 58 as a portion of the IF-stage thereof.

In the exemplary implementation of the mobile station 12 shown in FIG. 2, the mobile station forms a tri-mode device operable to communicate by way of three different types of cellular communication systems. Because a CDMA communication system, as defined, e.g., in an IS-95 standard, the frequency range within which a forward-link signal generated pursuant to such a standard is within a 615 kHz frequency range. Such a relatively wide frequency range causes operation of the mobile station in the CDMA mode to form the most critical case. That is to say, forward-link signals generated in the CDMA communication system are of a frequency range greater than the frequency ranges of signals generated during operation of a conventional AMPS or IS-54, TMDA system. Conversely, the 540 kHz wide AMPS band starts at a frequency 900 kHz away from its center frequency when a mixing signal applied on the line 48 to the first down-mixer 46 (shown at FIG. 2), a band gap of 285 kHz between the CDMA band of a 615 kHz results.

Figure 6:
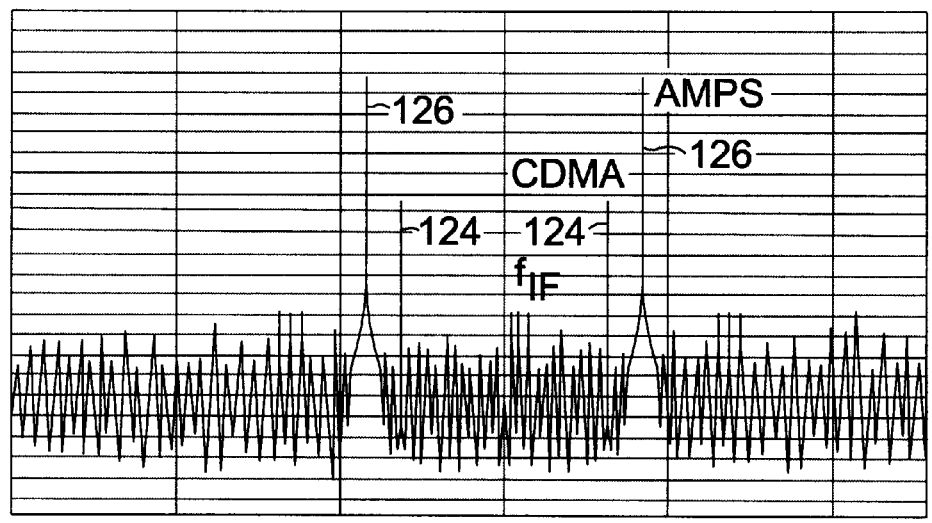
FIG. 6 illustrates a graphical representation, similar to those shown in FIGS. 4–5, but here representing a forward-link CDMA signal and an adjacent forward-link AMPS signal.

FIG. 6 illustrates the power spectrum 122 which illustrates an IF signal representative of a CDMA signal of a 615 kHz bandwidth tuned to its center frequency, here represented by the component portion 124 proximate to an AMPS signal having component portions 126. The power spectrum 122 graphically illustrates the relationship of a strong AMPS signal in close frequency-proximity to a CDMA signal of lower magnitude. As illustrated, the AMPS signal strength is as high as 80 dB above the CDMA signal. A conventional CDMA SAW (surface acoustic wave) filter is equivalent to an eighth-order bandpass filter and is able to provide at least 40 dB attenuation of the AMPS signal. Therefore, use of the ADC 58 works well as long as it is not overloaded by a residual AMPS signal which thereafter can be easily filtered out in a digital domain filter device.

Figure 7:
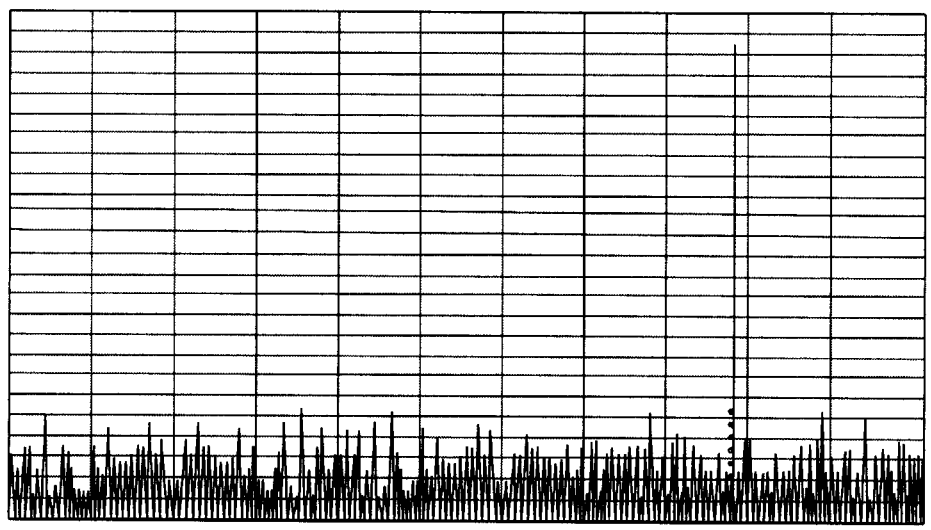
FIG. 7 illustrates a graphical representation of the power spectra of an IF signal, here a 128.1 megahertz (MHz)

FIG. 7 illustrates the power spectra 138 of an IF signal having a component center at 128.1 MHz, exemplary of a signal applied to the ΣΔADC 58 on the line 56 (shown at FIG. 2). The signal of which the power spectra 138 is shown is exemplary as signals generated at an IF-stage of a conventional mobile station is typically of a frequency greater than 100 MHz. To directly convert a signal of such a frequency into a digital domain, the ADC 58 must operate at a clock rate of at least 400 MHz. A further aspect of an embodiment of the present invention provides a manner by which to provide such clock rates while utilizing practical, submicron CMOS or BiCMOS technologies.

FIG. 8 illustrates a frequency representation 142 of a 39.4 MHz clock signal 144 together with second and third harmonics 146 and 148, respectively, of the clock signal. As a clock signal, in the time domain, is essentially a square wave, the clock signal exhibits strong harmonic components. As the frequency representation 142 shows, the second and third harmonics are of great enough magnitudes to permit their mixing together with the IF signal, such as that represented by the power spectra 138 shown in FIG. 7.

FIG. 9 illustrates the output product 152 resulting from mixing of the signal shown in FIG. 7 together with the frequency representation 142 shown in FIG. 8. Thereby, the ADC 58 requires a clock rate, $f_{clk}$, of four times the frequency of the center frequency $f_0$, i.e., $4 \times f_0$. As a result, the following equation can be used when constructing a sub-sampled, bandpass ΣΔADC by using clock harmonics:

$$f_0 = f_{IF} - nf_{clk} = f_{IF} - 4nf_0$$

wherein:

n is the order of the clock harmonic, 1, 2, 3 . . .

Analysis of the equation indicates that when n=1, the direct bandpass approach, described above, requires very high speed technology. But, when, e.g., $f_{IF}$=128.1 MHz, then the following occurs:

if n=1, then $f_0$=25.62 MHz and $f_{clk}$=102.48 MHz; if n=2, then $f_0$=14.23 Mhz and $f_{clk}$=56.92 MHz, and if n=3, then $f_0$=9.85 MHz and $f_{clk}$=39.4 MHz.

For values of n of 2 and 3, conventional technology can be used to implement the above-described circuitry.

FIG. 10 illustrates a method, shown generally at 162, of operation of an embodiment of the present invention. The method 162 is for operating upon signals received on a multi-mode radio receiver operable to receive first receive signals generated during operation on a first radio communication system and to receive at least second communication signals generated during operation of at least the second radio communication system. The first radio communication system is operable within a first frequency bandwidth, and the second radio communication system is operable within a second frequency bandwidth.

First, and as indicated by the block 164, indications of the first receive signals, when received at the radio receiver, and indications of the at least the second receive signals when received at the radio receiver, are selectively converted into first-converted first receive signals and at least first-converted second receive signals. respectively.

Then, and as indicated by the block 166, the signals are digitized at a bandpass digitizer. The bandpass digitizer exhibits a signal transfer function and a noise transfer function having dissimilar characteristics. Digitized signals are formed in which noise component portions of such signals are shifted in frequency.

The previous descriptions are of preferred examples for implementing the invention, and the scope of the invention should not necessarily be limited by this description. The scope of the present invention is defined by the following claims:

We claim:

1. In a multi-mode radio receiver operable to receive first receive signals generated during operation of a first radio communication system and to receive at least second communication signals generated during operation of at least a second radio communication system, the first radio communication system operable within a first frequency bandwidth and the second radio communication system operable within a second frequency bandwidth, an improvement of apparatus for operating upon signals generated during operation of the first radio communication system and signals generated during operation of at least the second communication system, said apparatus comprising:

a converter coupled to receive indications of the first receive signals when received at the radio receiver and to receive indications of the at least the second receive signals when received at the radio receiver, said converter for converting the indications received thereat to a first-converted frequency range, selectively to form first-converted first receive signals of the first frequency bandwidth and selectively to form at least first-converted second receive signals of at least the second frequency bandwidth; and a bandpass digitizer coupled to said converter to receive the first-converted first receive signals and the at least the first-converted second receive signals selectively formed by said converter, said bandpass digitizer for generating digitized signals in which noise component portions generated pursuant to digitizing of the first-converted first receive signal and the first-converted second receive signal, once digitized, are shifted in frequency.

2. The apparatus of claim 1 wherein the indications of the first receive signals and the indications of the at least the second receive signals to which said converter is coupled to receive are of radio frequencies and wherein said converter comprises a down-converter for down-converting the signals of the radio frequencies to intermediate frequencies.

3. The apparatus of claim 1 wherein the first receive signals and the second receive signals, respectively, to which said converter is coupled to receive are in analog form, and wherein said first-converted first receive signals and said first-converted second receive signals are in analog form.

4. The apparatus of claim 1 wherein said bandpass digitizer comprises a bandpass ΣΔ-analog-to-digital converter.

5. The apparatus of claim 4 wherein said bandpass ΣΔ-analog-to-digital converter is of an order of at least two.

6. The apparatus of claim 4 further comprising a digital mixer coupled to receive the digitized signals formed by said ΣΔ-analog-to-digital converter, said digital mixer for mixing together the digitized signals with digital sequences.

7. The apparatus of claim 6 wherein said digital mixer comprises a first mixer coupled to receive a first digital sequence and a second mixer coupled to receive a second digital sequence, the second digital sequence orthogonal to the first digital sequence.

8. The apparatus of claim 6 wherein said digital mixer comprises an exclusive-or logical gate.

9. The apparatus of claim 6 wherein said digital mixer generates a baseband digital representation of the first receive signals and of the at least second receive signals.

10. The apparatus of claim 9 further comprising first baseband receiver circuitry and at least second baseband receiver circuitry coupled to said digital mixer, said first baseband receiver circuitry for processing the baseband digital representation of the first receive signals and said at least second baseband receiver circuitry for processing the baseband digital representation of the second receive signals.

11. The apparatus of claim 1 further comprising a bandpass filter coupled between said converter and said bandpass digitizer, said bandpass filter exhibiting a passband which passes signals within both the first frequency bandwidth and within the at least the second frequency bandwidth.

12. The apparatus of claim 11 wherein said bandpass filter and digitizer is of a bandwidth at least as large as a largest of the first frequency bandwidth and the at least second frequency bandwidth.

13. The apparatus of claim 11 wherein the multi-mode radio receiver comprises a multi-mode cellular radio telephone operable in a first cellular communication system and in at least a second cellular communication system and wherein said converter is operable to form the first-converted first receive signals when the multi-mode radio telephone is operated in the first cellular communication system and to form the first-converted second receive signals when the multi-mode cellular radio telephone is operated in the second cellular communication system.

14. The apparatus of claim 13 wherein the multi-mode radio receiver comprises a tri-mode cellular radiotelephone, wherein the first radio communication system comprises an AMPS (advanced mobile phone system) communication system, wherein the at least second radio communication system comprises a TDMA (time-division, multiple-access) communication system, and a CDMA (code-division, multiple-access) communication system and wherein the passband exhibited by said bandpass filter encompasses signals transmitted on a forward-link in each of the AMPS, TDMA, and CDMA communicating systems, respectively.

15. The apparatus of claim 1 further comprising a clock signal generator coupled to said bandpass digitizer, said clock signal generator for generating clock pulses for clocking operation of said bandpass digitizer, the clock pulses of a frequency at least four times a center frequency of signals formed by said converter.

16. A method for operating upon signals received at a multi-mode radio receiver operable to receive first receive signals generated during operation of a first radio communication system and to receive at least second communication signals generated during operation of at least a second radio communication system, the first radio communication system operable within a first frequency bandwidth and the second radio communication system operable within a second frequency bandwidth, said method comprising:

converting indications of the first receive signals, when received at the radio receiver, and indications of the at least the second receive signals, when received at the radio receiver, selectively into first-converted first receive signals of the first frequency bandwidth and selectively into at least first-converted second receive signals of at least the second frequency bandwidth; and digitizing the first-converted first receive signals and the at least the first-converted second receive signals, formed during said operation of converting, at a bandpass digitizer, to form digitized signals in which noise component portions of the first-converted first receive signal and the first-converted second receive signal, once digitized, are shifted in frequency.

17. The method of claim 16 wherein said operation of converting comprises down-converting in frequency the indications of the first receive signals and the at least the second receive signals from a radio frequency to an intermediate frequency.

18. The method of claim 16 wherein the bandpass digitizer at which the first-converted first receive signals and the at least the first-converted second receive signals are digitized during said operation of digitizing, are performed by a bandpass ΣΔADC (analog-to-digital converter).

19. The method of claim 18 comprising the additional operation of clocking the bandpass ΣΔADC with a clock signal, the clock signal of a frequency at least four times a center frequency of the first-converted signals formed during said operation of converting.

20. Apparatus for operating upon receive signals received at a receive portion of a multi-mode cellular transceiver operable at least alternately to communicate by way of a first cellular communication system and at least a second cellular communication system, receive signals received at the cellular transceiver generated during operation of the first cellular communication system of a first frequency bandwidth and receive signals received at the cellular transceiver generated during operation of the at least the second cellular communication system of at least a second frequency bandwidth, said apparatus comprising:

a converter coupled to receive indications of the receive signals received at the receive portion, said converter for forming intermediate-frequency analog representations of the receive signals;

a bandpass filter coupled to receive the intermediate-frequency analog representations formed by said converter, said bandpass filter exhibiting a bandpass at least as large as a largest of the first frequency bandwidth and the at least the second frequency bandwidth, said bandpass filter for passing intermediate-frequency filtered signals within the bandpass thereof; and a bandpass digitizer coupled to said bandpass filter, said bandpass digitizer for digitizing the intermediate-frequency filtered signals passed by said bandpass filter, thereby to form digitized signals in which noise component portions generated pursuant to digitizing of the intermediate-frequency filtered signals, once digitized, are shifted in frequency.

* * * * *